(12) United States Patent
Liaw (10) Patent No.: US 7,592,675 B2
(45) Date of Patent: Sep. 22, 2009

(54) PARTIAL FINFET MEMORY CELL (75) Inventor: Jhon-Jhy Liaw, Hsin-Chu (TW)

(73) Assignee: Taiwan Semiconductor Manufacutring Company, Ltd., Hsin-Chu (TW)

( * ) Notice: Subject to any disclaimer, the term of this patent is extended or adjusted under 35 U.S.C. 154(b) by 21 days.

(21) Appl. No.: 11/588,483

(22) Filed: Oct. 27, 2006

(65) Prior Publication Data
US 2008/0105932 A1 May 8, 2008

Related U.S. Application Data (60) Provisional application No. 60/849,047, filed on Oct. 2, 2006.

(51) Int. Cl.
*H01L 27/092* (2006.01)
(52) U.S. Cl. .................. 257/371; 257/374; 257/401; 257/E27.062
(58) Field of Classification Search ........... 257/371, 257/374, 401, 903, 904, E27.062, E27.067, 257/E27.098
See application file for complete search history.

(56) References Cited

U.S. PATENT DOCUMENTS

| 6,911,383 | B2 | 6/2005 | Doris et al. |
| 6,924,560 | B2 | 8/2005 | Wang et al. |
| 6,967,351 | B2 | 11/2005 | Fried et al. |
| 2005/0029556 | A1* | 2/2005 | Wang et al. ............ 257/250 |
| 2007/0080387 | A1* | 4/2007 | Liu et al. ............... 257/303 |

FOREIGN PATENT DOCUMENTS

JP   1591838 A   3/2005

* cited by examiner

Primary Examiner—Evan Pert
Assistant Examiner—Selim Ahmed
(74) Attorney, Agent, or Firm—Slater & Matsil, L.L.P.

(57) ABSTRACT

A semiconductor structure includes a semiconductor substrate, a planar PMOS device at a surface of the semiconductor substrate, and an NMOS device at the surface of the semiconductor substrate, wherein the NMOS device is a Fin field effect transistor (FinFET).

20 Claims, 9 Drawing Sheets

PARTIAL FINFET MEMORY CELL

This application claims the benefit of U.S. Provisional Application No. 60/849,047, filed on Oct. 2, 2006, entitled A Partial FinFET Memory Cell, which application is hereby incorporated herein by reference.

TECHNICAL FIELD

This invention relates generally to semiconductor devices, and more particularly to memory cells, and even more particularly to the fabrication of integrated circuits comprising static random access memory cells.

BACKGROUND

Scaling of semiconductor devices (e.g., a metal-oxide semiconductor field-effect transistor) has enabled continued improvement in speed, performance, density, and cost per unit function of integrated circuits over the past few decades. Continued scaling of MOSFETs results in severe degradation of carrier mobility, however, which in turn adversely affects the device drive current. To further enhance the performance of MOS devices, carrier mobility enhancement becomes a key element in developing next-generation technologies. Among efforts to improve carrier mobility, introducing stress into the channel region of MOS devices is widely adopted. Generally, it is desirable to induce a tensile stress in the channel region of an n-type metal-oxide-semiconductor ("NMOS") device in a source-to-drain direction, and to induce a compressive stress in the channel region of a p-type metal-oxide-semiconductor ("PMOS") device in a source-to-drain direction.

A commonly used method for applying compressive stress to the channel regions of PMOS devices is growing SiGe stressors in the source and drain regions of the respective PMOS devices. Such a method typically includes the steps of forming recesses in a silicon substrate along edges of gate spacers, epitaxially growing SiGe stressors in the recesses, and annealing. Since SiGe has a greater lattice constant than the silicon substrate does, after annealing, it applies a compressive stress to a channel region, which is located between a source SiGe stressor and a drain SiGe stressor.

Figure 1:
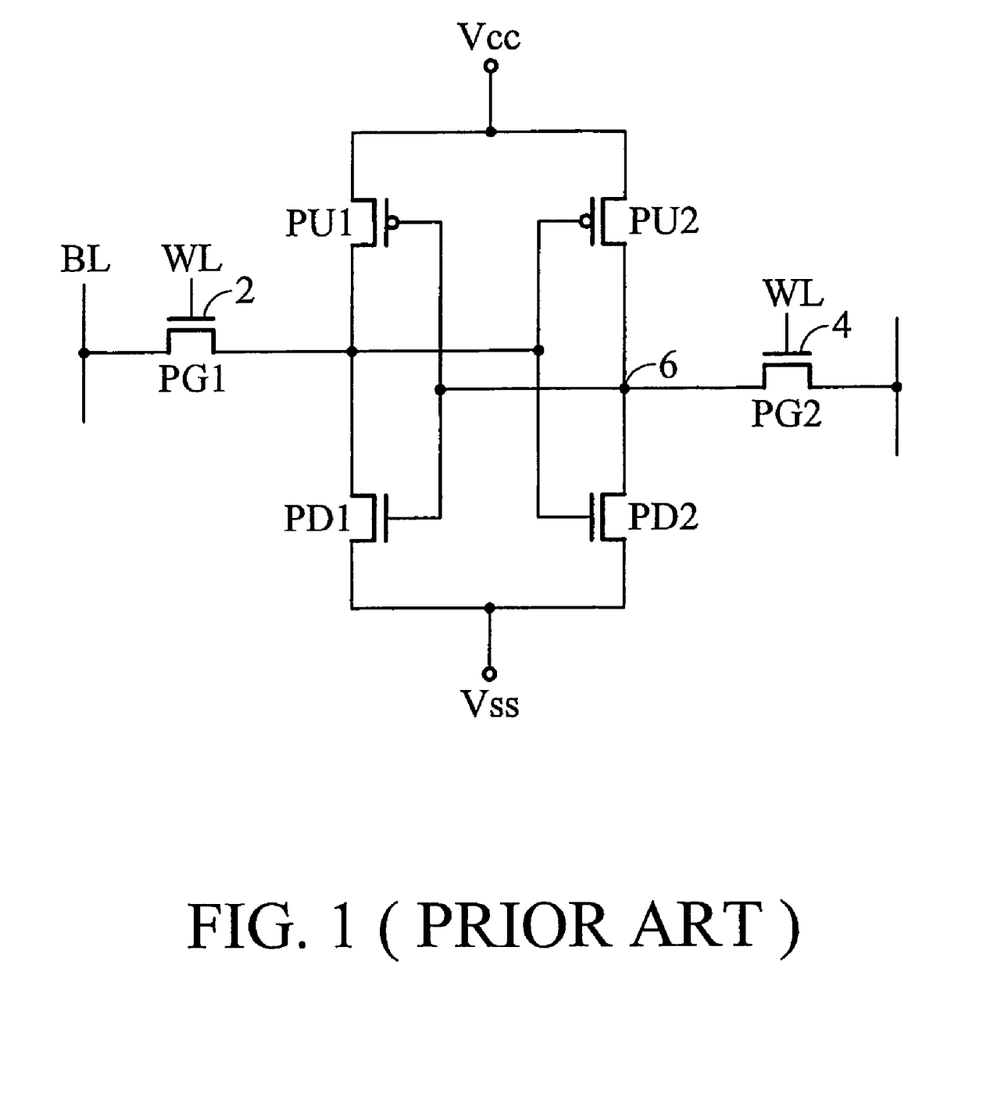
FIG. 1 illustrates a circuit diagram of a conventional six-transistor SRAM cell.

The above-discussed method, however, suffers drawbacks when used for the formation of static random access memory (SRAM) cells. FIG. 1 illustrates an exemplary circuit diagram of a six-transistor SRAM cell, which includes pass-gate transistors PG1 and PG2, pull-up MOS devices PU1 and PU2 and pull-down MOS devices PD1 and PD2. Gates 2 and 4 of the respective pass-gate MOS devices PG1 and PG2 are controlled by word-lines WL that determines the selection of the current SRAM cell. A latch formed of pull-up MOS devices PU1 and PU2 and pull-down MOS devices PD1 and PD2 stores a state. The stored state can be read or written through a bit line BL.

Conventionally, on a memory chip, PMOS devices in both peripheral circuits and memory circuits are formed with SiGe stressors, which result in a significant improvement in the drive currents of the pull-up PMOS devices in SRAM cells. The drive currents of pull-down NMOS devices, however, are relatively difficult to improve, and thus have smaller drive currents. The unbalanced performance of PMOS and NMOS devices causes a writing problem. For example, the pull-up MOS device PU2 has a high drive current, hence a high ability for supplying charges from Vcc to node 6. Conversely, NMOS device PD2 has a relatively low drive current, hence a low ability for discharging charges from node 6 to Vss. Consequently, when a "0" is written into the memory cell, it takes a long period of time to write the state "0." Additionally, write margins of the SRAM cells are degraded due to the high drive currents of PMOS devices. A low write margin results in an increased possibility of erroneous writing. To achieve high performance SRAM cells, read and write operations are preferably balanced. Therefore, it is preferred that the drive currents of pull-up PMOS devices and pull-down NMOS devices are balanced.

Conventionally, the drive currents of NMOS devices may be improved by increasing gate width of the NMOS devices. Such a solution, however, contradicts to the requirement of scaling integrated circuits. Particularly, memory devices need to have high densities. Therefore, increasing gate width of NMOS devices in memories is not a preferred method. A novel method for solving the above-discussed problem without causing the reduction in memory device densities is thus needed.

SUMMARY OF THE INVENTION

In accordance with one aspect of the present invention, a semiconductor structure includes a semiconductor substrate, a planar PMOS device at a surface of the semiconductor substrate, and an NMOS device at the surface of the semiconductor substrate, wherein the NMOS device is a Fin field effect transistor (FinFET).

In accordance with another aspect of the present invention, a memory cell includes a semiconductor substrate, a PMOS region in the semiconductor substrate, an n-well region in the PMOS region, first shallow trench isolation (STI) regions in the PMOS region wherein the first STI regions have first top surfaces, an NMOS region in the semiconductor substrate, a p-well region in the NMOS region, second STI regions in the NMOS region wherein the second STI regions have second top surfaces lower than the first top surfaces, a PMOS device at a surface of the n-well region, and an NMOS device at a surface of the p-well region.

In accordance with yet another aspect of the present invention, a memory cell includes a pass-gate MOS device, a pull-down MOS device electrically connected to the pass-gate MOS device, wherein the pass-gate MOS device and the pull-down MOS device are FinFETs, and a pull-up MOS device electrically connected to the pass-gate MOS device and the pull-down MOS device, wherein the pull-up MOS device is a planar MOS device.

The embodiments of the present invention have more balanced PMOS and NMOS performance, and thus the performance of memory cells is improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A through 7A are cross-sectional views of intermediate stages in the manufacture of a first embodiment of the present invention, wherein the formation of a pull-up MOS device, a pull-down MOS device and a pass-gate MOS device is illustrated;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
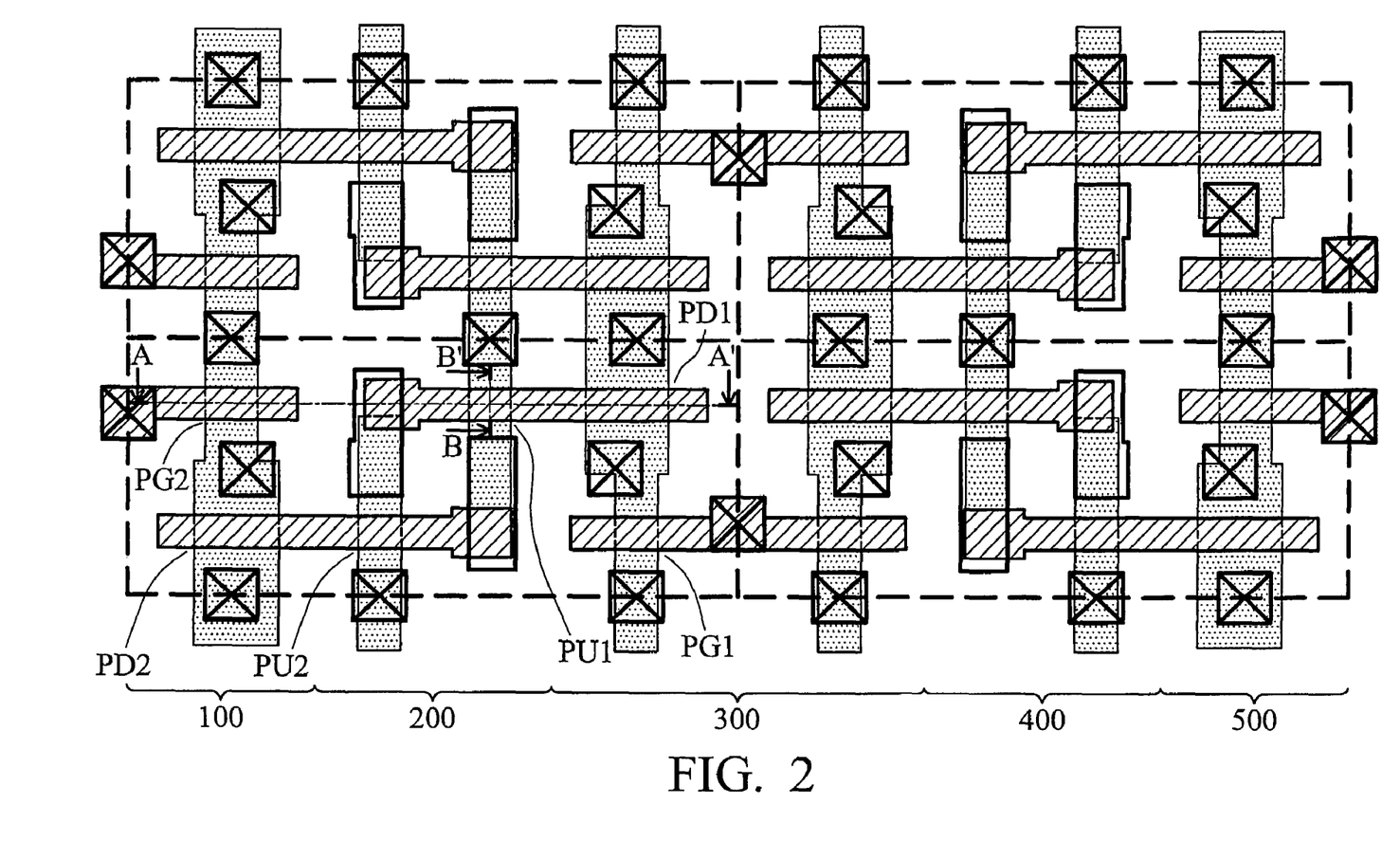
FIG. 2 illustrates an exemplary layout of an embodiment of the present invention.

FIG. 2 illustrates an exemplary layout of an embodiment of the present invention. Four six-transistor (6T) unit memory cells are formed, each being inside a region defined by dotted lines. The layout illustrates p-well regions 100, 300 and 500, which are for forming n-type metal-oxide-semiconductor (MOS) devices, and n-well regions 200 and 400, which are for forming p-type MOS devices. For simplicity, in the subsequent illustrated drawings, only the unit memory cell at left bottom corner of FIG. 2 is discussed.

In the illustrated exemplary layout, each unit memory cell includes six MOS devices. Referring to the unit memory cell shown at the left bottom corner, a first inverter comprises pull-up MOS device PU1 and pull-down MOS device PD1. A second inverter includes pull-up MOS device PU2 and pull-down MOS device PD2. The unit memory cell further includes two pass-gate MOS devices PG1 and PG2. Pull-up MOS devices PU1 and PU2 are PMOS devices, while pull-down MOS devices PD1 and PD2 and pass-gate MOS devices PG1 and PG2 are NMOS devices.

Figure 3A:
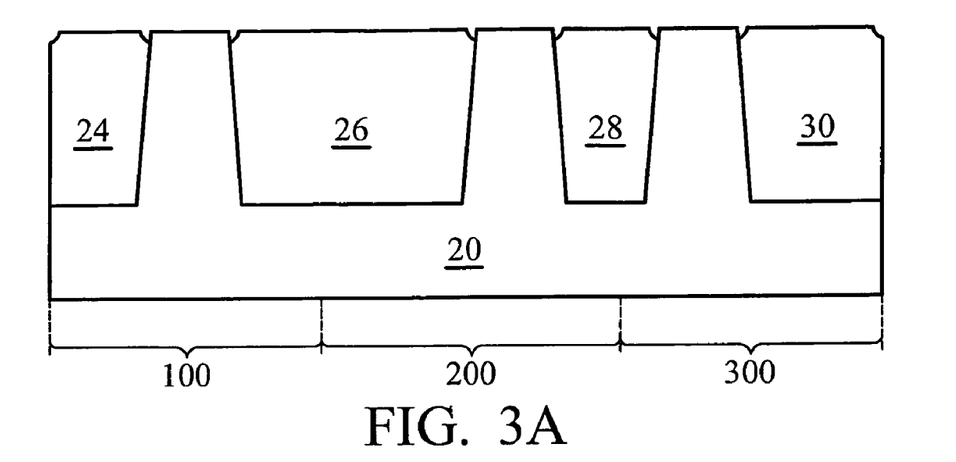

FIGS. 3A through 7A are cross-sectional views of intermediate stages in the formation of a unit memory cell, wherein the cross-sectional views are taken along a plane crossing line A-A' in FIG. 2. Therefore, the cross-sectional views illustrates the formation of MOS devices PG2, PU1 and PD1, from left to right. Referring to FIG. 3A, a portion of substrate 20 is illustrated. Preferably, substrate 20 comprises bulk silicon. Alternatively, substrate 20 comprises bulk SiGe or other semiconductor materials. Shallow trench isolation (STI) regions 24, 26, 28 and 30 are formed in substrate 20 to isolate device regions. As is known in the art, STI regions 24, 26, 28 and 30 may be formed by etching substrate 20 to form recesses, and then filling the recesses with dielectric materials, for example, high-density plasma (HDP) oxides, TEOS oxides, O3 oxides, or combinations layers such as e.g., a high K dielectric combined with oxide).

Figure 3B:
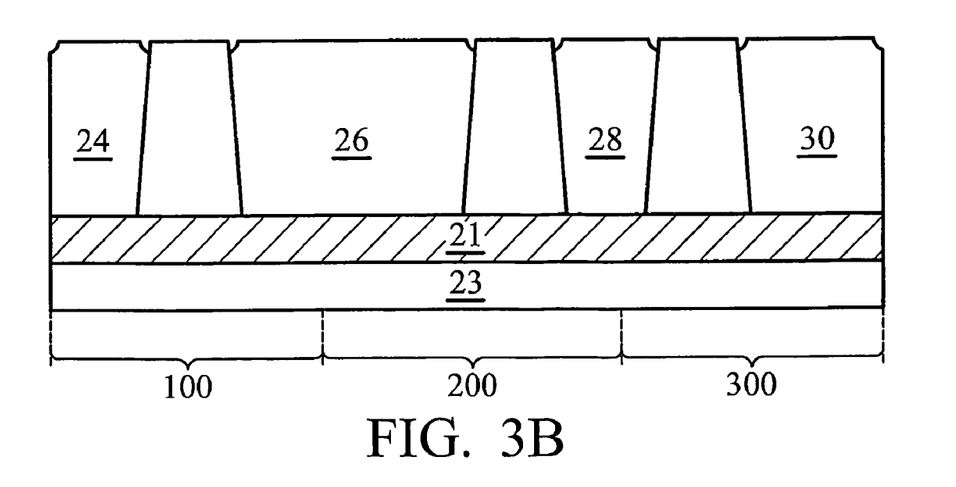

FIG. 3B illustrates another embodiment of the present invention, wherein substrate 20 includes a silicon-on-insulator (SOI) structure. Preferably, STI regions 24, 26, 28 and 30 extend to a top surface of buried oxide layer 21, which is further located on a semiconductor layer 23.

Figure 4:
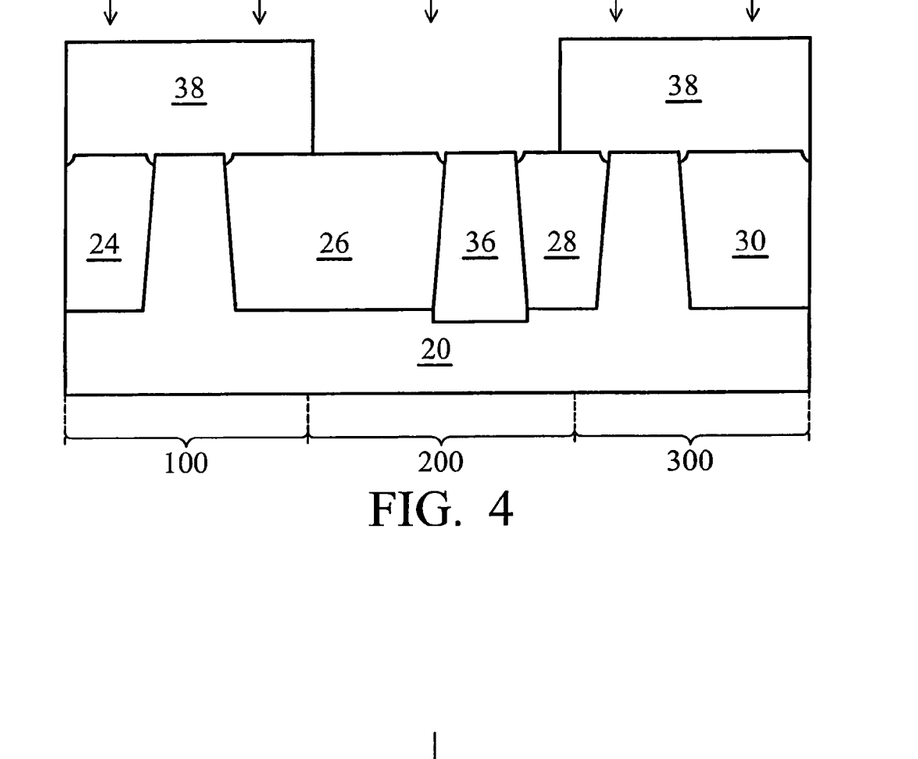

FIG. 4 illustrates the formation of an n-well region 36. Photoresist 38 is formed and patterned to cover regions 100 and 300 while exposing region 200. An n-type impurity, which may include phosphorous and/or arsenic, is then implanted, forming n-well region 36. A cell implantation may be performed to implant n-type impurities, so that the threshold voltages of subsequently formed PMOS devices are tuned to desired values. Photoresist 38 is then removed.

Figure 5:
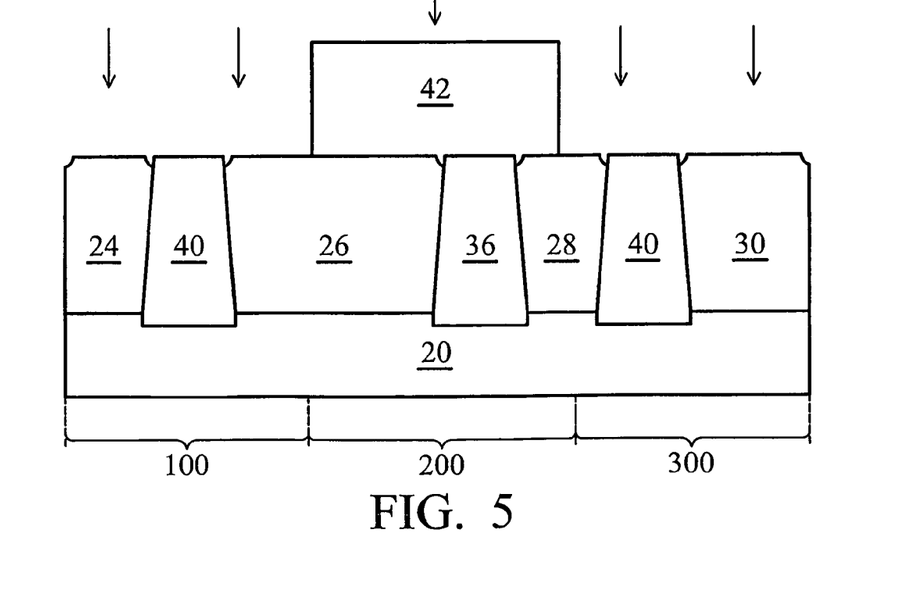

Referring to FIG. 5, photoresist 42 is formed to mask region 200 while leaving regions 100 and 300 exposed, and p-type impurities are implanted to form p-well regions 40. P-type impurities preferably include boron and/or indium. A cell implantation may be performed to implant p-type impurities, so that the threshold voltages of subsequently formed NMOS devices are tuned to a desired value. Photoresist 42 is then removed.

Figure 6:
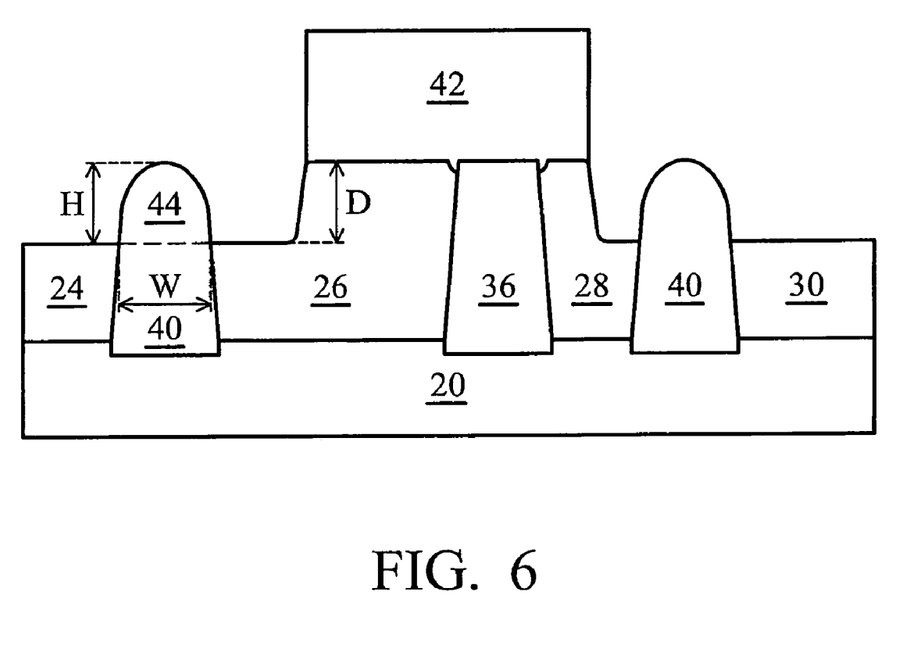

Referring to FIG. 6, an etching process is performed to recess top portions of exposed STI regions 24, 26, 28 and 30, preferably using an etchant that attacks STI regions 24, 26, 28 and 30, but not substrate 20. Exemplary etchants include a HF containing wet dip, a Chlorine based dry etch, a Fluorine based dry etch, and the like. In the preferred embodiment, after the recessing of STI region 24, 26, 28 and 30, the top surfaces of STI regions have a vertical distance H from top surfaces of active regions. Preferably, vertical distance H is greater than about 30 nm. The top surface of STI regions 24, 26, 28 and 30 are preferably recessed by a vertical distance D, which is preferably greater than about 30 nm. It is to be realized, however, that vertical distances H, D and other dimensions recited throughout the description will be scaled accordingly with the scaling of the formation technology. Active region 44, which is a portion of substrate 20 over top surfaces of recessed STI regions 24 and 26, has a width W. In the preferred embodiment, a ratio of height H of active region 44 to width W is preferably greater than about 0.5. In alternate embodiments, the ratio is about 1, whern channel width W is shrunk to less than, say, 40 nm. Please note that corners of active region 44 tend to be rounded by the etching process and cleaning processes. The roundness is related to the dimensions of the integrated circuits. Typically, the smaller the dimensions of the integrated circuits are, the more rounded the corners are. After the etching, photoresist 42 is removed.

Figure 7A:
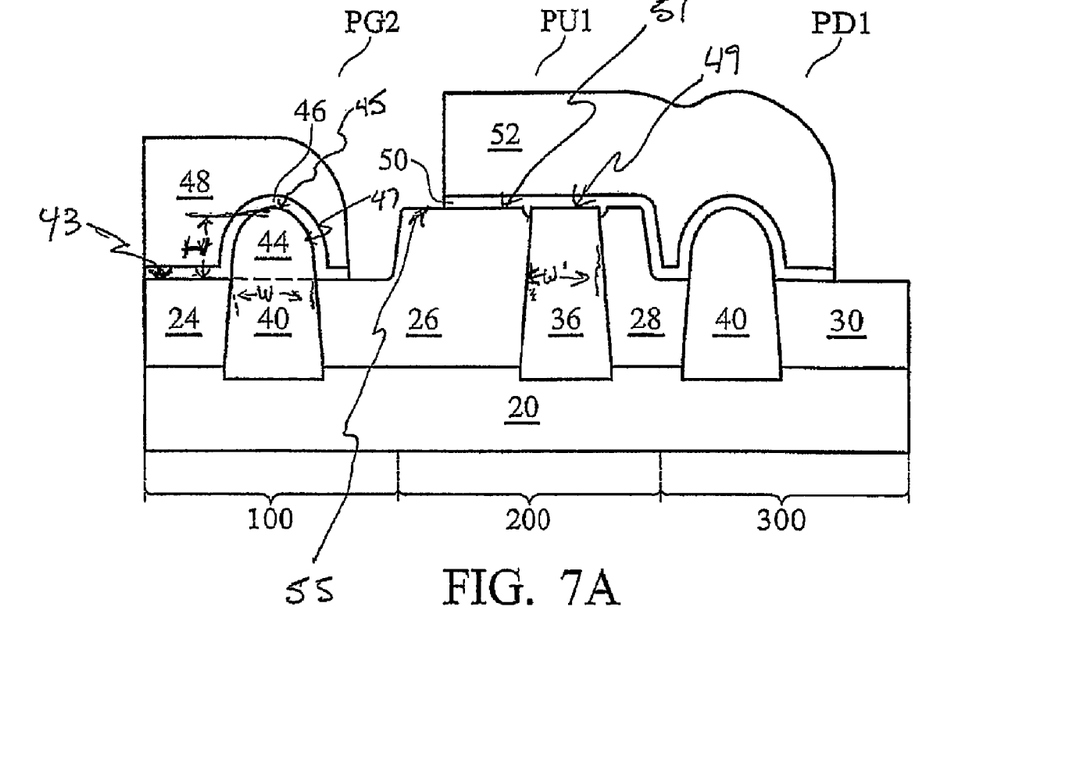

Referring to FIG. 7A, gate dielectrics 46 and 50 and gate electrodes 48 and 52 are formed. Gate dielectrics 46 and 50 preferably include commonly used dielectric materials such as oxides, nitrides, oxynitrides, high K dielectrics (e.g, Ta2O5, Al2O3, HfO) and combinations thereof. Gate electrodes 48 and 52 may be formed of polysilicon. Alternatively, gate electrodes 48 and 52 are formed of other commonly used conductive materials such as poly-Si, metals, metal silicides, metal nitrides, and combinations thereof. As is known in the art, gate dielectrics 46 and 50 and gate electrodes 48 and 52 may be formed by stacking a gate electrode layer on a gate dielectric layer, and then patterning the stacked layers.

In FIG. 7A, reference 43 is to the top surface of the STI region 24. which is lower than 55. the higher portion of the top surface of STI region 26. Reference numeral 45 identifies the top surface of the semiconductor strip 44, which is distance H above the top surface 43 or STI 24. With W and height H are the width and height of portion 44. Reference numeral 51 is the top surface of the insulating region adjoining the N type active area 36 with top surface 49, which is at or about the same level as the top surface 51 of the higher portion of adjoining insulation region 26. The width of the N type active area 36 is designated W'.

Figure 7B:
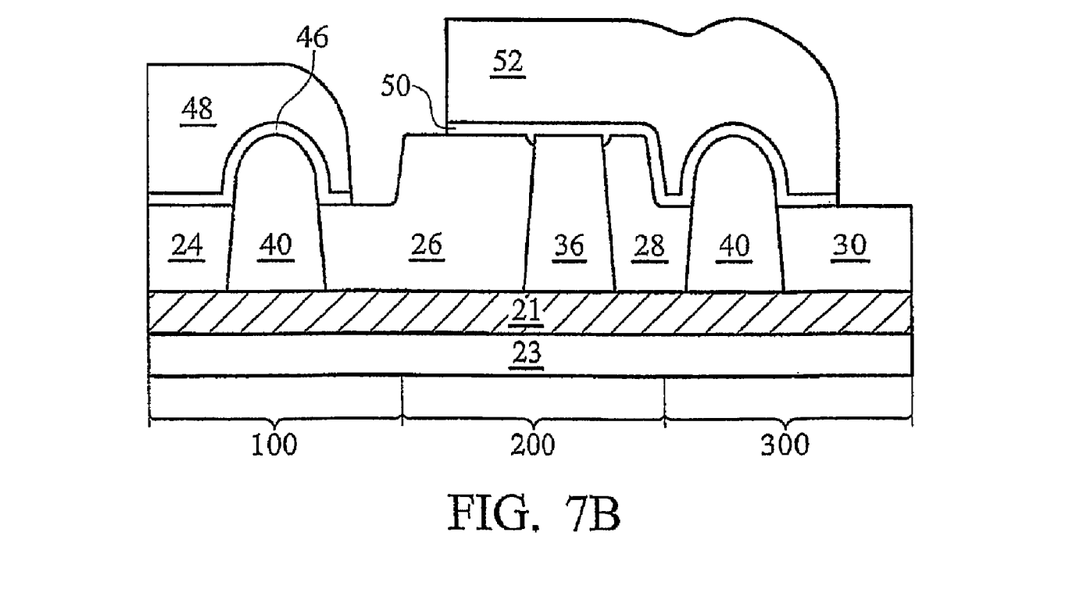
FIG. 7B illustrates a second embodiment of the present invention, wherein a silicon-on-insulator structure is used.

FIG. 7B illustrates an embodiment of the present invention formed on a SOI structure, wherein active regions may be isolated from each other by STI regions and buried oxide layer 21. The formation steps of the structure shown in FIG. 7B are similar to the embodiment formed on a bulk semiconductor. One skilled in the art will realize the respective formation processes.

Figure 8:
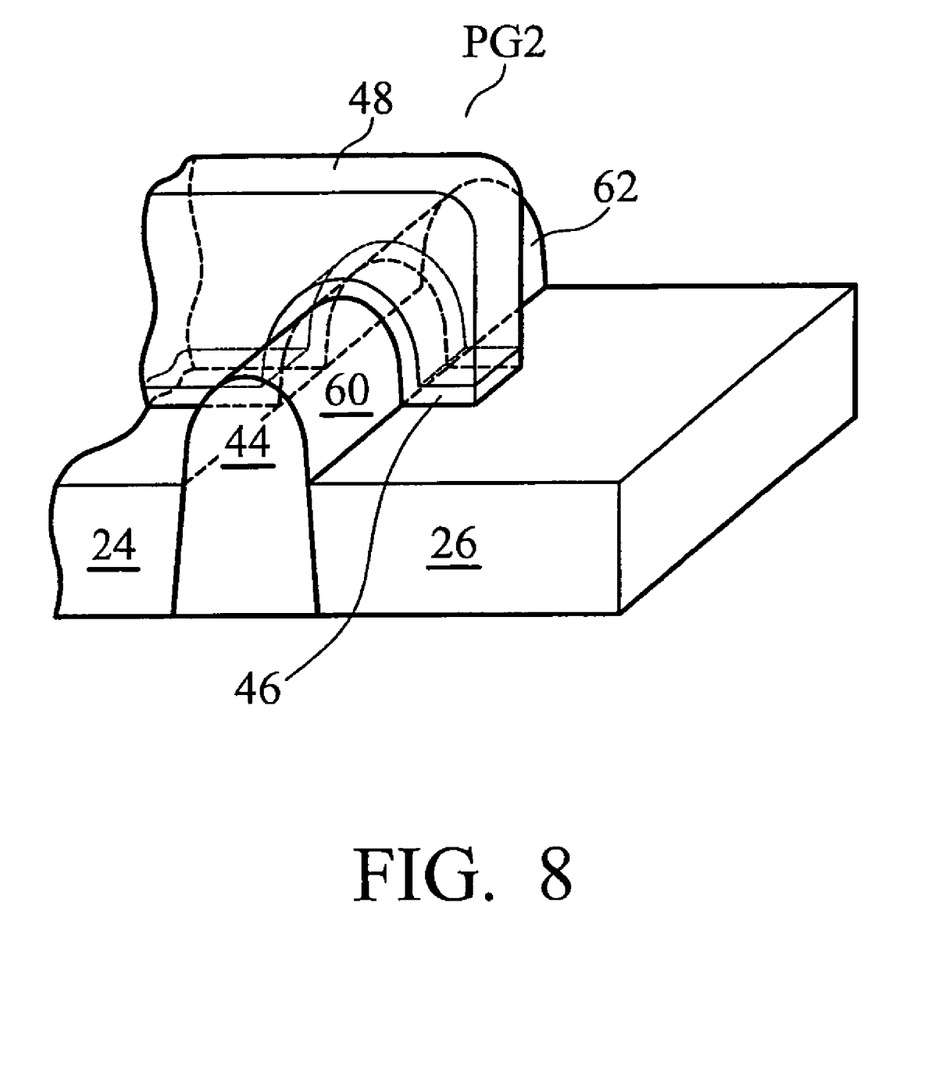
FIG. 8 illustrates a perspective view of a pass-gate MOS device.

In subsequent process steps, region 200 is masked, and regions 100 and 300 are exposed. LDD regions, gate spacers and source/drain regions are then formed to finish the formation of NMOS devices PG2 and PD1. FIG. 8 illustrates a perspective view of NMOS device PG2 after the formation of gate dielectric 46 and gate electrode 48, wherein the features shown in FIG. 7A may be identified through like reference numerals.

As shown in FIG. 8, active region 44 is higher than the top surfaces of STI regions 24 and 26, forming a semiconductor strip. Dielectric 46 and gate electrode 48 thus cover top surface and sidewalls of semiconductor strip 44. In subsequent process steps, lightly-doped source/drain (LDD) regions (not shown) may be formed by an implantation to introduce an n-type impurity. LDD regions (and subsequently formed source/drain regions 60 and 62) may also be co-implanted with nitrogen and/or carbon, which retard the diffusion of impurities. Gate spacers (not shown) are then formed on sidewalls of gate dielectric 46 and gate electrode 48, wherein the sidewalls are perpendicular to the longitudinal direction of semiconductor strip 44. Source/drain regions 60 and 62 are then formed by an implantation, wherein n-type impurities are introduced.

It is to be realized that the resulting NMOS device is a Fin field transistor (FinFET). As is known in the art, since the sidewalls and top surface of active regions 44 all contribute to the increase in channel width, and thus the channel width of the FinFET PG2 is effectively increased over planar MOS devices. As a result, the drive current of FinFET PG2 is increased. At the same time pass-gate MOS device PG2 is formed, pass-gate MOS device PG1 and pull-down MOS device PD1 and PD2 are also formed. Since STI regions 28 and 30 are also recessed, the resulting pass-gate MOS device PD1 is also a FinFET (refer to FIG. 7A). In the preferred embodiment, STI regions in all NMOS device regions 100, 300 and 500 are recessed, and thus the resulting pass-gate MOS devices and pull-down devices are all FinFETs.

Figure 9:
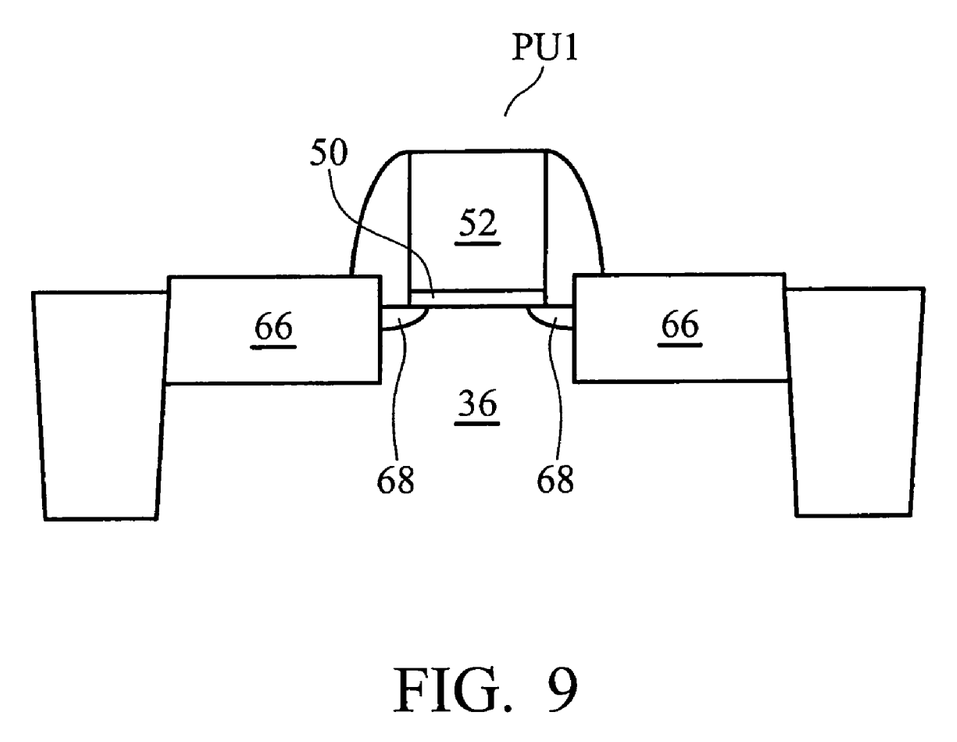
FIG. 9 illustrates a cross-sectional view of a pull-up MOS device.

Referring back to FIG. 7A, regions 100 and 300 are masked, and PMOS device PU1 is formed in region 200. As is known in the art, PMOS devices preferably comprise SiGe stressors to apply compressive stresses to their channel regions, which results in increased carrier motilities, hence increased drive currents. A cross-sectional view of PMOS device PU1 is schematically illustrated in FIG. 9, wherein the cross-sectional view is taken from a plane crossing line B-B' in FIG. 2.

A brief formation process of PMOS device PU1 is discussed as follows. LDD regions 68 are formed by implanting p-type impurities, such as boron and/or indium. Dummy spacers (not shown), which are preferably thin, for example, having a thickness of between about 100 Å and about 200 Å, may be formed. Recesses are then formed in n-well region 36 by etching anisotropically or isotropically. SiGe is then filled into the recesses, forming SiGe stressors 66. The preferred methods for filling SiGe include selective epitaxial growth (SEG). P-type impurity may be doped when the formation of SiGe stressors 66 proceeds, and/or implanted after SiGe stressors 66 are formed, thus forming source/drain regions. Carbon may be doped into LDD regions 68 and the source/drain regions to retard the diffusion of impurities. At the time PMOS device PU1 is formed, PMOS device PU2 is also formed.

Figure 7C:
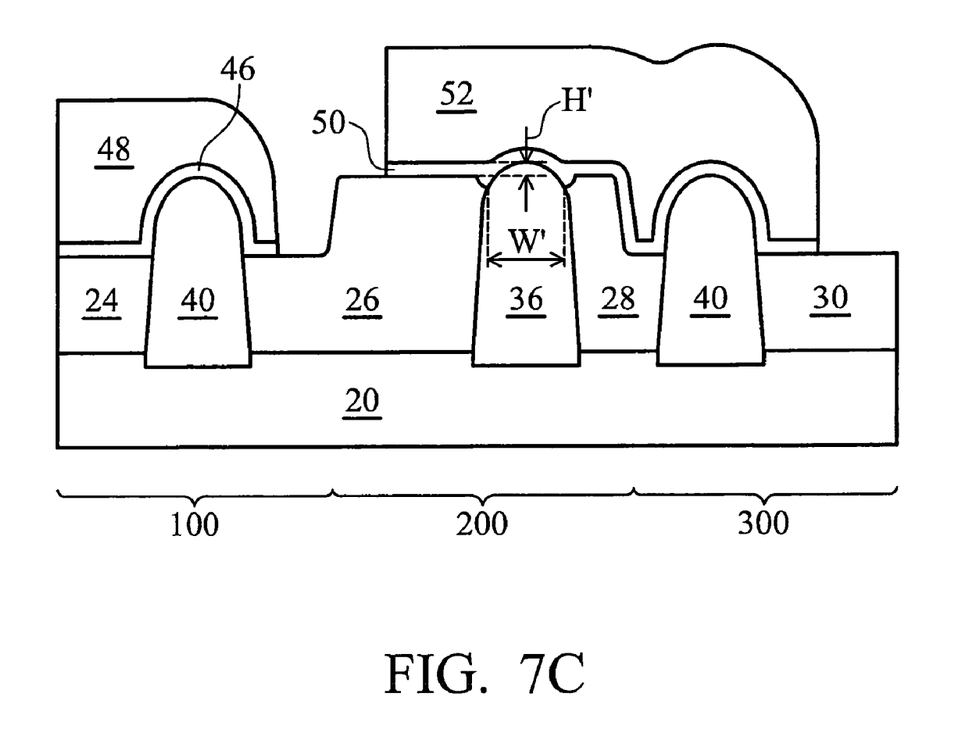
FIG. 7C illustrates a third embodiment of the present invention, wherein an active region of a pull-up MOS device has a top surface higher than a top surface of the adjoining shallow trench isolation (STI) regions.

One skilled in the art will realize that due to different formation methods for forming memory cells, a PMOS device may also have a raised channel region, which have a top surface higher than the adjoining STI regions. An exemplary embodiment of the PMOS device is illustrated in FIG. 7C. In this case, the active regions of PMOS device PU1 may also have a top surface and sidewalls, wherein the top surface of the active region and a top surface of the adjoining STI region have a vertical distance H'. However, in such PMOS devices, a ratio of height H' to a width W' of the PMOS device is less than about 1, and more likely to be less than about 0.5. Such PMOS devices are also considered as planar MOS devices.

In the previously discussed embodiment, P-well regions 40 and n-well region 36 are formed before the recessing of STI regions 24, 26, 28 and 30. In other embodiments, the step of forming recesses in STI regions 24, 26, 28 and 30 may be performed before the formation of p-well regions 40 and n-well region 36.

Although the 6T memory cells are used to explain the concept of the present invention, one skilled in the art will realize that the concept of the present invention are readily available for the formation of memory cells comprising different number of MOS devices, such as 8T, 10T, 12T, etc.

In the embodiments of the present invention, PMOS devices are formed as planar MOS devices, while NMOS devices are formed as FinFETs. Therefore, the drive currents of NMOS devices are improved, while drive currents of PMOS devices are not increased. Since drive currents of PMOS devices can be easily increased by forming SiGe stressors, the currents of PMOS devices and NMOS devices are more balanced. An advantageous feature of the present invention is that the process steps of the present invention are fully compatible with existing formation processes of memory cells. No extra mask is required.

Advantageous features of embodiments may include a method for forming a semiconductor structure includes providing a semiconductor substrate, forming a planar p-type metal-oxide-semiconductor (PMOS) device at a surface of the semiconductor substrate, and forming an n-type metal-oxide-semiconductor (NMOS) device at the surface of the semiconductor substrate, wherein the NMOS device is a Fin field effect transistor (FinFET). Aspects of the invention relating to FinFET devices setting could include but do not necessarily include different top surface (channel width) dimension between pull-down (PD) devices and pass gate (PG) devices, or could have substantially the same top surface (channel width) dimension on both PD devices and PG devices.

Another embodiment includes a method for forming a semiconductor structure includes providing a semiconductor substrate comprising a PMOS region and an NMOS region, forming an n-well region in the PMOS region, forming a p-well region in the NMOS region, recessing STI regions in the NMOS region so that the p-well region comprises a portion substantially higher than the STI regions in the NMOS region, wherein the PMOS region is masked during the step of recessing, forming a gate dielectric layer in the PMOS region and the NMOS region, forming a gate electrode layer on the gate dielectric layer, patterning the gate dielectric layer and the gate electrode layer to form a first gate stack in the NMOS region and a second gate stack in the PMOS region, forming an NMOS device using the first gate stack, and forming a PMOS device using the second gate stack, wherein a source and drain regions of the PMOS device have at least a portion comprising SiGe.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a planar p-type metal-oxide-semiconductor (PMOS) device at a surface of the semiconductor substrate; and
   an n-type metal-oxide-semiconductor (NMOS) device at the surface of the semiconductor substrate, wherein the NMOS device is a Fin field effect transistor (FinFET);
   wherein the NMOS and PMOS device are within a unit memory cell.

2. The semiconductor structure of claim 1, wherein the NMOS device comprises:
   a semiconductor strip having a top surface higher than a top surface of an adjoining insulation region by a vertical difference, wherein a ratio of the vertical difference to a width of the semiconductor strip is greater than about 0.5;
   a gate dielectric on the top surface and sidewalls of the semiconductor strip; and
   a gate electrode on the gate dielectric.

3. The semiconductor structure of claim 1, wherein the NMOS device comprises:
   a semiconductor strip having a top surface higher than a top surface of an adjoining insulation region by a vertical difference, wherein a ratio of the vertical difference to a width of the semiconductor strip is greater than about 1;
   a gate dielectric on the top surface and sidewalls of the semiconductor strip; and
   a gate electrode on the gate dielectric.

4. The semiconductor structure of claim 1, wherein the PMOS device comprises:
   an active region having a top surface higher than a top surface of an adjoining insulation region by a vertical distance, wherein a ratio of the vertical distance to a width of the active region have a ratio of less than about one;
   an gate dielectric on the top surface of the active region; and
   a gate electrode on the gate dielectric.

5. The semiconductor structure of claim 1, wherein the PMOS device comprises:
   an active region having a top surface substantially level with or lower than a top surface of an adjoining insulation region by a vertical distance;
   a gate dielectric on the top surface of the active region; and
   a gate electrode on the gate dielectric.

6. The semiconductor structure of claim 1, wherein the PMOS device and the NMOS device are separated by a shallow trench isolation (STI) region having a first portion with a first top surface and a second portion with a second top surface, and wherein the first top surface is higher than the second top surface, and wherein the PMOS device adjoins the first portion, and the NMOS device adjoins the second portion.

7. The semiconductor structure of claim 1, wherein all PMOS device in the unit memory cell are planar devices, and all NMOS devices in the unit memory cell are FinFETs.

8. The semiconductor structure of claim 1, wherein the PMOS device and the NMOS device form an inverter of the unit memory cell.

9. The semiconductor structure of claim 8, wherein a gate electrode of the PMOS device and a gate electrode of the NMOS device are in a continuous conductive strip.

10. The semiconductor structure of claim 1, wherein the PMOS device is a pull-up device of the unit memory cell, and wherein the NMOS device is a device selected from the group consisting essentially of a pull-down MOS device and a pass-gate MOS device.

11. A memory cell comprising:
    a semiconductor substrate;
    a PMOS region in the semiconductor substrate;
    an n-well region in the PMOS region;
    first shallow trench isolation (STI) regions in the PMOS region, wherein the first STI regions have first top surfaces;
    an NMOS region in the semiconductor substrate;
    a p-well region in the NMOS region;
    second STI regions in the NMOS region, wherein the second STI regions have second top surfaces lower than the first top surfaces;
    a PMOS device at a surface of the n-well region; and
    an NMOS device at a surface of the p-well region.

12. The memory cell of claim 11, wherein the NMOS device is a FinFET, and wherein the PMOS device is a planar MOS device.

13. The memory cell of claim 11, wherein the NMOS device comprises a semiconductor strip having a top surface higher than the second top surfaces, and wherein a ratio of a height of the semiconductor strip to a width of the semiconductor strip is greater than about 0.5.

14. The memory cell of claim 11, wherein the NMOS device comprises a semiconductor strip having a top surface higher than the second top surfaces, and wherein a ratio of a height of the semiconductor strip to a width of the semiconductor strip is greater than about 1.

15. The memory cell of claim 13, wherein the PMOS device comprises an active region with a top surface higher than the first top surfaces by a vertical distance, and wherein a ratio of a vertical distance to a width of the active region is less than about 1.

16. A memory cell comprising:
    a pass-gate MOS device;
    a pull-down MOS device electrically connected to the pass-gate MOS device, wherein the pass-gate MOS device and the pull-down MOS device are FinFETs; and
    a pull-up MOS device electrically connected to the pass-gate MOS device and the pull-down MOS device, wherein the pull-up MOS device is a planar MOS device.

17. The memory cell of claim 16 being a six-transistor memory cell.

18. The memory cell of claim 16, wherein the pull-down MOS device comprises a semiconductor strip having a top surface higher than top surfaces of STI regions adjoining the semiconductor strip, and wherein a ratio of a height of the semiconductor strip to a width of the semiconductor strip is greater than about 0.5, and wherein the pull-up MOS device comprises an active region with a top surface higher than top surfaces of STI regions adjoining the active region, and wherein a ratio of a height of the active region to a width of the active region is less than about 1.

19. The memory cell of claim 16, wherein the pull-down MOS device comprises a semiconductor strip having a top surface higher than top surfaces of STI regions adjoining the semiconductor strip, and wherein a ratio of a height of the semiconductor strip to a width of the semiconductor strip is greater than about 0.5, and wherein the pull-up MOS device comprises an active region with a top surface substantially close to or lower than top surfaces of STI regions adjoining the active region.

20. The memory cell of claim 16, wherein the pull-up MOS device and the pull-down MOS device share a common gate dielectric strip and a common gate electrode strip.

* * * * *